United States Patent
Kawagishi et al.

(10) Patent No.: US 8,058,854 B2
(45) Date of Patent: Nov. 15, 2011

(54) DRIVE CIRCUIT

(75) Inventors: Norihiro Kawagishi, Tokyo (JP);
Kazuyoshi Asakawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 490 days.

(21) Appl. No.: 12/343,548

(22) Filed: Dec. 24, 2008

(65) Prior Publication Data

US 2009/0184603 A1 Jul. 23, 2009

(30) Foreign Application Priority Data

Jan. 18, 2008 (JP) .................................. 2008-009206

(51) Int. Cl.
*G05F 1/577* (2006.01)
(52) U.S. Cl. ..................... 323/267; 327/108; 327/112
(58) Field of Classification Search .................. 323/265, 323/267–269, 349, 350; 327/108, 111, 112, 327/269, 270, 538–541, 543; 326/87; 310/317
See application file for complete search history.

(56) References Cited

U.S. PATENT DOCUMENTS

| 5,539,341 | A  | * | 7/1996  | Kuo ............................... 327/108 |
| 5,973,520 | A  | * | 10/1999 | Maruyama ..................... 327/108 |
| 6,166,570 | A  | * | 12/2000 | Hedberg ........................ 327/108 |
| 6,215,340 | B1 | * | 4/2001  | Nomura ......................... 327/112 |
| 6,882,187 | B1 | * | 4/2005  | Kim et al. ...................... 327/112 |
| 6,885,225 | B2 | * | 4/2005  | Ohmichi et al. ............... 327/112 |
| 7,532,445 | B2 | * | 5/2009  | Rana et al. ....................... 361/56 |

FOREIGN PATENT DOCUMENTS

JP 05-301344 11/1993

* cited by examiner

*Primary Examiner* — Adolf Berhane
*Assistant Examiner* — Yemane Mehari
(74) *Attorney, Agent, or Firm* — Volentine & Whitt, PLLC

(57) ABSTRACT

A drive circuit includes a plurality of output drive terminals and a plurality of push-pull circuit stages. Each of the push-pull circuit stages includes a pair of complementary transistors having a common terminal connected to a respective output drive terminal. The drive circuit further includes a plurality of first transistors connected in series with at least one of the pair of complementary transistors of the push-pull circuit stages, respectively, and a common second transistor. The common second transistor is connected with each of the plurality of first transistors to form a current mirror circuit. The drive circuit further includes a mirror current setting circuit for setting a mirror current flowing through the common transistor.

16 Claims, 4 Drawing Sheets

DRIVE CIRCUIT

BACKGROUND OF THE INVENTION

1. Field of the Invention

The present invention relates to a drive circuit which may be utilized to drive a plurality of capacitive loads independently from each other.

A claim of priority is made to Japanese patent application number 2008-009206, filed Jan. 18, 2008, the subject matter of which is incorporated herein by reference.

2. Description of the Related Art

Drive circuits including a plurality of capacitive loads, and a load drive circuit for driving each of the plurality of capacitive loads independently from each other are generally known. The drive circuits have been used for driving multi-nozzle heads, for example, and are capable of driving a predetermined load only at a predetermined timing.

Japanese Patent Application Laid-Open Publication No. H5-301344, discloses a drive circuit including n circuits of totem-pole type load drive circuits consisting of PNP transistors and NPN transistors. In the disclosed drive circuits, resistors for determining charge time constants or discharge time constants are connected to each of output terminals corresponding to each of the loads. Consequently, the charge time constants or the discharge time constants of the above drive circuit can be individualized at each of the output terminals.

The drive circuits disclosed in the Japanese Patent Application Laid-Open Publication No. H5-301 require resistors for determining the charge time constant or the discharge time constant with respect to each of the loads, and therefore a drawback thereof is that is becomes relatively complicated to determine the charge time constant or the discharge time constant in the case where transistors, capacitors, and resistors, etc., for configuring the drive circuit are integrated on the semiconductor substrates.

In addition, a measurement of connecting external resistors to the loads, etc. as resistors for determining the charge time constant or the discharge time constant is possible as a measure to reduce variations in the charge time constant or the discharge time constant. In the measurement, as the number of the loads to be driven increases, the number of the pins for connecting the external resistors to the circuit including the external resistors and the loads increases, and therefore another drawback arises in that cost reductions and/or the circuit miniaturization are difficult to achieve.

SUMMARY OF THE INVENTION

According to an aspect of the present invention, a drive circuit is provided which includes a plurality of output drive terminals and a plurality of push-pull circuit stages. Each of the push-pull circuit stages includes a pair of complementary transistors having a common terminal connected to a respective output drive terminal. The drive circuit further includes a plurality of first transistors connected in series with at least one of the pair of complementary transistors of the push-pull circuit stages, respectively, and a common second transistor. The common second transistor is connected with each of the plurality of first transistors to form a current mirror circuit. The drive circuit further includes a mirror current setting circuit for setting a mirror current flowing through the common transistor.

BRIEF DESCRIPTION OF THE DRAWINGS

The above and other objects and new features of the present invention will become readily apparent from the following detailed description, with reference to the accompanying drawings, wherein.

DETAILED DESCRIPTION OF EMBODIMENTS

Figure 1:
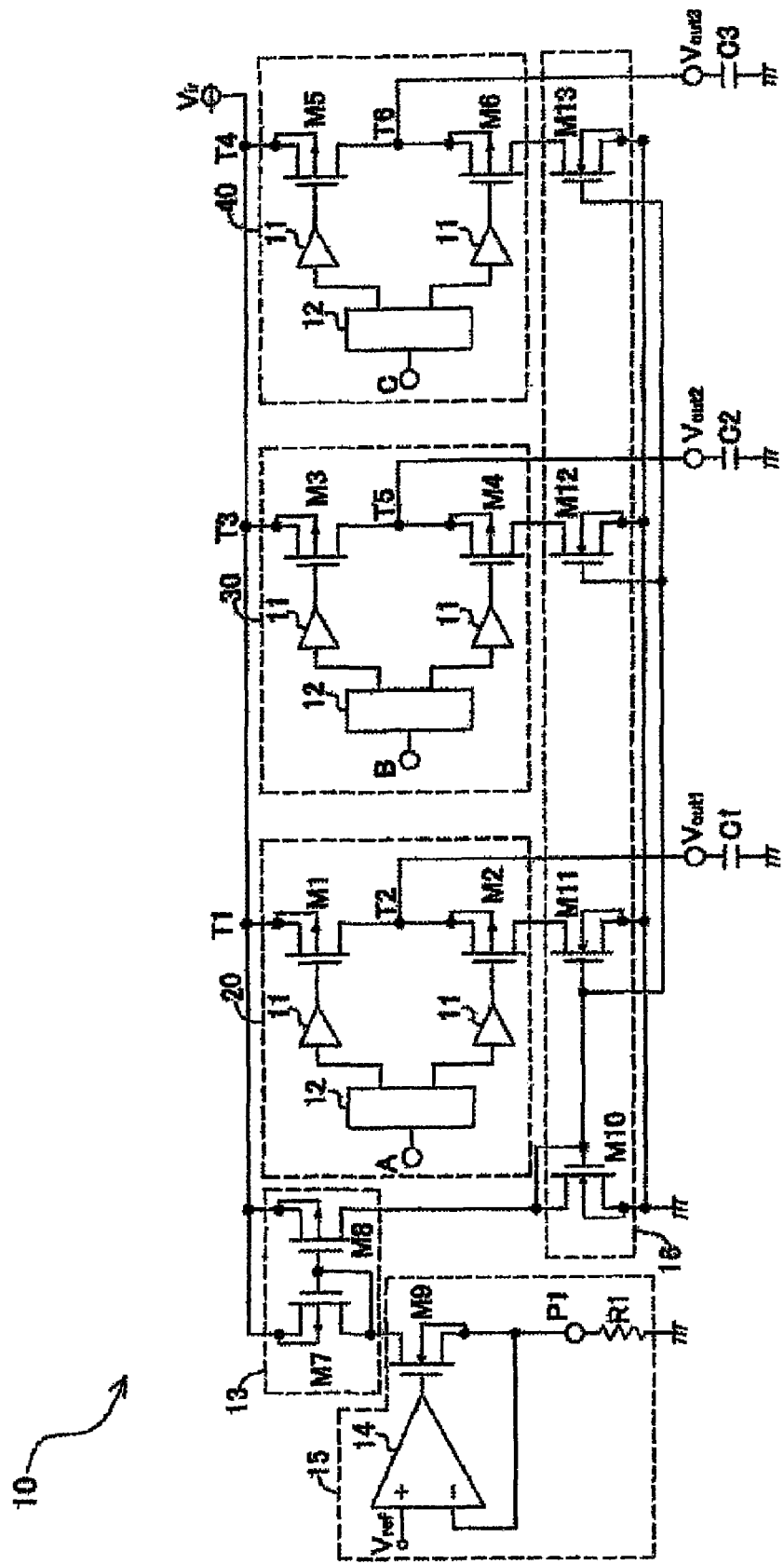
FIG. 1 is a circuit diagram of a drive circuit according to the first embodiment of the invention.

The present invention will be described in detail below with reference to preferred, but non-limiting, embodiments of the invention. In the drawings, like or similar elements are reference by the same reference number. Also, for the sake of brevity, redundant descriptions of like or similar elements is avoid were possible.

FIG. 1 is a circuit diagram of a drive circuit 10 which drives a plurality of capacitive loads C1~C3 according to an embodiment of the present invention.

As shown in FIG. 1, the drive circuit 10 of this example includes a first current mirror circuit 16, a current mirror setting circuit 15, a second current mirror circuit 13, and plural load drive circuits 20, 30 and 40.

The load drive circuit 20, 30 and 40 are similarly configured, and respectively drive the capacitive loads C1~C3.

In particular, the load drive circuit 20 of FIG. 1 includes P-type MOS transistors M1 and M2, a buffer circuit 11, an input interface circuit 12, and an input terminal A.

A power supply voltage source Vin is connected to a source of the P-type MOS transistor MI through a connecting point T1. A drain of the P-type MOS transistor M1 is connected to an output terminal Vout1 and to the source of a P-type MOS transistor M2 through a connecting point T2. The P-type MOS transistors M1 and M2 have a complementary relationship and are connected as a push-pull circuit having a midpoint T2. That is, the push-pull stage is configured by the P-type MOS transistors M1 and M2. The output terminal Vout1 is connected to a ground voltage through the capacitive load C1. Gates of the P-type MOS transistors M1 and M2 are connected to an input interface circuit 12 through a buffer circuit 11. An input terminal A is connected to the input interface circuit 12 and supplies a predetermined input signal.

As mentioned above, load drive circuits 30 and 40 have essentially the same configuration as the load drive circuit 20, and connected to the power supply voltage source Vin thorough connecting points T3 and T4, respectively. As shown in FIG. 1, the load drive circuit 30 is configured by P-type MOS transistors M3 and M4, the buffer circuit 11, the input interface circuit 12, and an input terminal B, and is connected to an output terminal Vout2 (capacitive load C2). The load drive circuit 40 is configured by P-type MOS transistors M5, M6, the buffer circuit 11, the input interface circuit 12, and an input terminal C, and is connected to an output terminal Vout3 (capacitive load C3). Furthermore, the P-type MOS transistors of the load drive circuits 30 and 40 having also complementary relationship are connected as push-pull circuits and components of push-pull stages.

Independent and/or unsynchronized signals may be respectively input to the input terminals A, B, and C, and in this case, the loads C1, C2 and C3 may be driven at different timings from one another.

In addition, the number of the loads and the load drive circuits are not limited to three shown in FIG. 1, and the quantity is flexible corresponding to equipment utilizing the drive circuit. Although the buffer circuit 11 and the input interface circuit 12 of each of the load drive circuits have the same reference numeral, the buffer circuit 11 and the input interface circuit 12 having different characteristics can be used.

The second current mirror circuit 13 includes P-type MOS transistors M7 and M8, each having sources connected to the power supply voltage source Vin. Gates of the P-type MOS transistors M7 and M8 are connected to each other.

The current mirror setting circuit 15 includes an operational amplifying circuit 14, an N-type MOS transistor M9, and a resistor R1. A drain and the gate of the P-type MOS transistor M7 of the second current mirror circuit 13 is connected to a drain of the N-type MOS transistor M9. A source of the N-type MOS transistor M9 is connected to the resistor R1 through a connecting pin P1, and the resistor R1 is connected to the ground voltage. Also, the source of the N-type MOS transistor M9 is connected to a negative input terminal of the operational amplifying circuit 14. A positive input terminal of the operational amplifying circuit 14 is connected to the reference voltage source Vref. The reference voltage source Vref is preferably a voltage source exhibiting little or no dependency on temperature variations and the like.

The first current mirror circuit 16 includes N-type MOS transistors M10, M11, M12 and M13. A drain of the P-type MOS transistor M8 of the second current mirror circuit 13 is connected to a drain and a gate of the N-type MOS transistor M0. The gate of the N-type MOS transistor M10 is connected to gates of each of the N-type MOS transistors M11, M12, and M13. Drains of the N-type MOS transistors M11, M12, and M13 are connected to the load drive circuits 20, 30, and 40, respectively. Specifically, the drain of the N-type MOS transistor M11 is connected to the drain of the P-type MOS transistor M2 of the load drive circuit 20, the drain of the N-type MOS transistor M12 is connected to the drain of the P-type MOS transistor M4 of the load drive circuit 30, and the drain of the N-type MOS transistor M13 is connected to the drain of the P-type MOS transistor M6 of the load drive circuit 40. Further, sources of the N-type MOS transistors M10, M11, M12, and M13 are connected to the ground voltage.

According to the configuration of the drive circuit of FIG. 1, the N-type MOS transistor M9 is constantly in an ON state, and a first stationary current flows through resistor R1 which is roughly obtained by dividing the reference voltage Vref by the resistor R1. The flow of the first stationary current places the gates of the P-type MOS transistors M7 and M8 at a constant LOW voltage, thus maintaining the P-type MOS transistors M7 and M8 in an ON state. As such, the second current mirror circuit 13 generates a second stationary current which is applied to the first current mirror circuit 16.

The second stationary current maintains the gates of the N-type MOS transistors M10, M11, M12, and M13 at a HIGH level, and accordingly, the N-type MOS transistors M10, M11, M12, and M13 are maintained in an ON state.

The second stationary current flowing from the second current mirror circuit 13 causes a third stationary current to selective flow in the N-type MOS transistors M10, M11, M12, and M13. That is, the third stationary current (which, as explained above, depends upon Vref and R1) flows in the N-type MOS transistors M11, M12 and M13 when the corresponding capacitive loads C1, C2 and C3 are discharged.

An operation of the drive circuit 10 will be explained next with reference to the timing diagram of FIG. 2.

Figure 2:
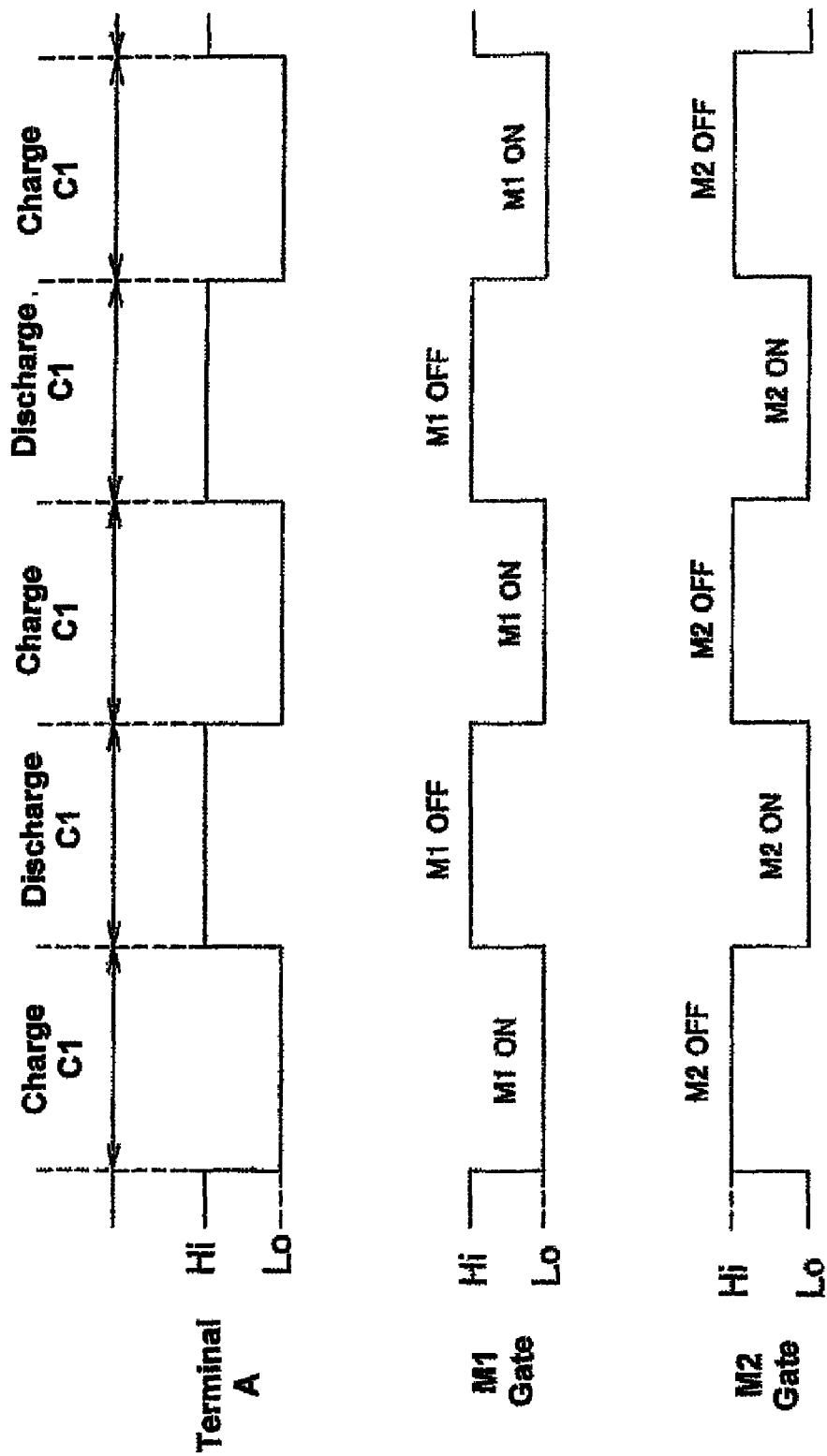
FIG. 2 is a timing chart showing operations of the drive circuit according to the first embodiment of the invention.

As shown in FIG. 2, in a state where the input signal to the input terminal A is at a LOW (Lo) level, the input interface circuit 12 and buffer circuit 11 are configured to apply a LOW level signal to the gate of the P-type MOS transistor M1, and to apply a HIGH (Hi) level signal to the gate of the P-type MOS transistor M2. On the other hand, when the input signal to the input terminal A is at a HIGH level, the input interface circuit 12 and buffer circuit 11 are configured to apply a HIGH level signal to the gate of the P-type MOS transistor M1, and to apply a LOW level signal to the gate of the P-type MOS transistor M2.

Thus, when the input signal at terminal A is initially at a LOW level, the P-type MOS transistor M1 is turned ON (conductive state), and the P-type MOS transistor M2 is turned OFF (non-conductive state). In this state, the output Vout1 is driven by Vin through transistor M1, and the capacitive load C1 is charged.

When the input signal at terminal A becomes a LOW level, the P-type MOS transistor M1 is turned OFF (non-conductive state), and the P-type MOS transistor M2 is turned ON (conductive state). In this state, the output Vout1 is coupled to ground through transistors M2 and M11, and the capacitive load C1 is discharged.

The current magnitude from the drain of the P-type MOS transistor M2 to the drain of the N-type MOS transistor M11 is determined by the third stationary current described previously, which in turn is dependent upon the resistor R1 as explained above. Consequently, the current magnitude from the drain of the P-type MOS transistor M2 is determined by the resistor R1, and thus a discharge time constant of the load drive circuit 20 determined by the current magnitude from the drain of the P-type MOS transistor M2 is also determined by the resistor R1 of the mirror current setting circuit 15.

By repeating the above-mentioned input of the input signal to the input terminal A, on/off driving the load C1 is repeated, and then the discharge time constant is constantly determined by the resistor R1. Furthermore, it is preferable to perform the control so that a shot current does not flow in the P-type MOS transistors M1 and M2.

The load circuits 30 and 40 operate in the same manner (tuning on/off the capacitive loads C2 and C3, respectively) as the load drive circuit 20, corresponding to input signals from the input terminals B and C. Consequently, in the off-state (i.e. in discharge) of the loads C2 and C3, a current flows in the P-type MOS transistors M4 and M6, and also the third stationary current flows in the N-type MOS transistors M12 and M13. Again, the discharge time constants of the load drive circuits 30 and 40 are determined by the resistor R1.

In addition, since each of currents flowing from the drains of the P-type MOS transistors M2, M4, and M6 can be adjusted by setting a current mirror ratio of the current mirror circuit 16 with respect to each of the load drive circuits, the discharge time constants different with respect to each of the load drive circuits can be determined. Further, N-type transistors can replace the P-type MOS transistors M2, M4, and M6. In the above case, the input signal inputted from the input terminal can be outputted to the above replaced N-type MOS transistor from the input interface circuit 12 without replacing HIGH level or LOW level of the input signal by LOW level or HIGH level thereof.

As explained above, according to the drive circuit of the present embodiment, since the mirror current value flowing in the common transistor is set by the mirror current setting circuit in the configuration that each of the current mirror transistors is serially inserted into at least one transistor of the pair of transistors included in each of the push-pull output stages, and the common transistor configuring the current mirror circuit with each of the above current mirror transistors is installed, variations in the discharge time constant can be reduced without increasing the number of the resistors for determining the discharge time constant of the driving paths of the capacitive loads.

Another embodiment of the present invention with now be described with reference to FIG. 3. The embodiment of FIG. 3 is that same as that of FIG. 1, except that additional N-type MOS transistors M31, M32 and M33 are included for discharging the respective capacitive loads C1, C2 and C3.

Figure 3:
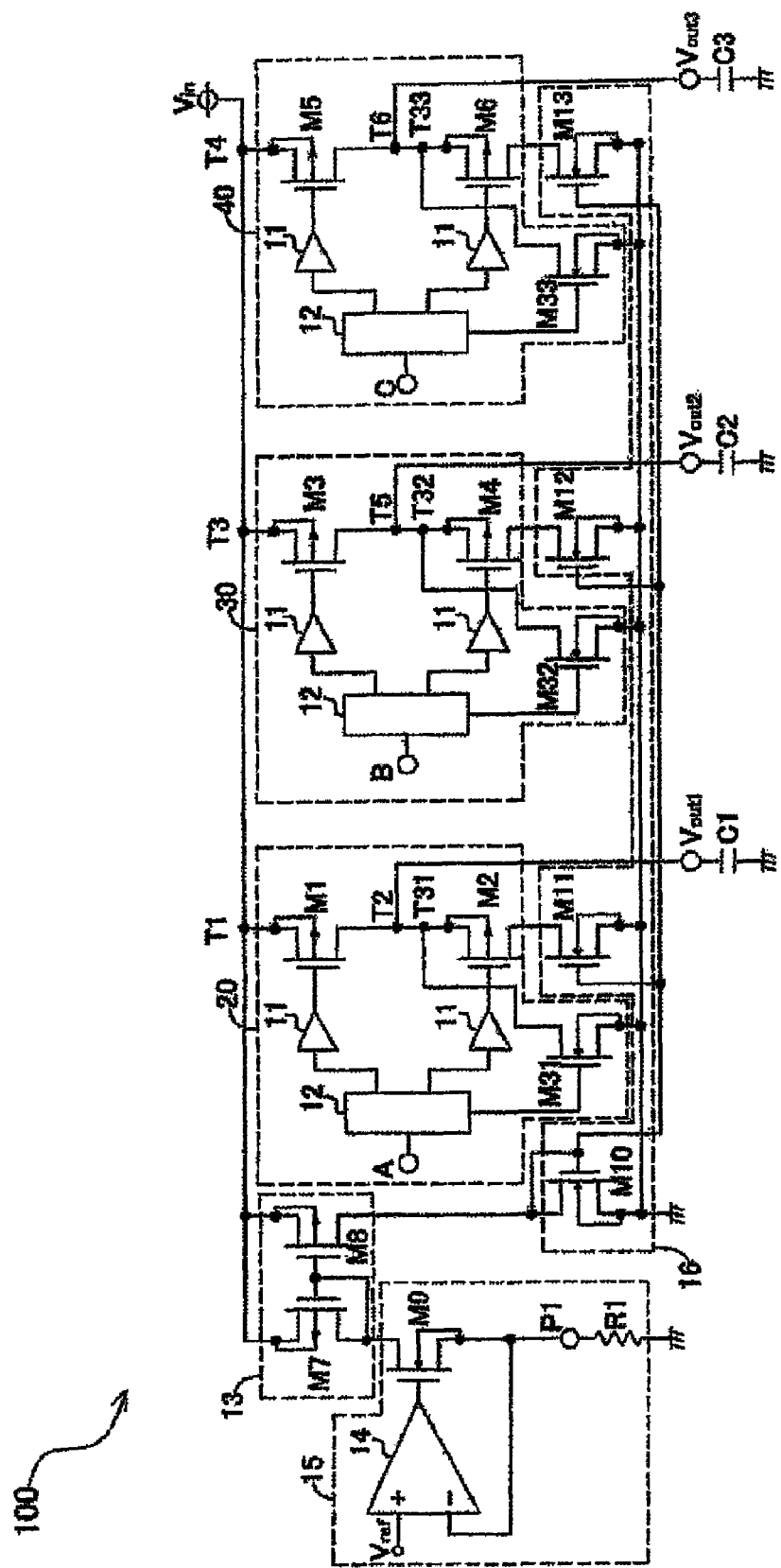
FIG. 3 is a circuit diagram of a drive circuit according to the second embodiment of the invention.

As shown in FIG. 3, the input interface circuit 12 of the load drive circuit 20 is connected to a gate of the N-type MOS transistor M31. A drain of the N-type MOS transistor M31 is connected to an output terminal Vout and the load C1 through connecting points T31 and T2. In addition, a source of the N-type MOS transistor M31 is connected to the ground voltage. In load drive circuits 30 and 40, each of N-type MOS transistors M32 and M33 is similarly configured.

The N-type MOS transistors M31, M32, and M33 become an ON state simultaneously as the P-type MOS transistors M2, M4, and M6 for discharging the loads, and change to an OFF state earlier than the P-type MOS transistors M2, M4, and M6. In other words, the P-type MOS transistors M2, M4, and M6 are in the ON state in the case where the N-type MOS transistors M31, M32, and M33 are the ON state, and therefore a capacitance stored in each of the loads is discharged by two MOS transistors. Since no N-type MOS transistor configuring the current mirror circuit 16 is connected to sources of the N-type MOS transistors M31, M32, and M33, larger currents flow in the N-type MOS transistors M31, M32, and M33 than the currents flowing in the N-type MOS transistors M2, M4, and M6. Consequently, the loads are discharged more rapidly than in the first embodiment, and the discharge time constants can be made longer.

Figure 4:
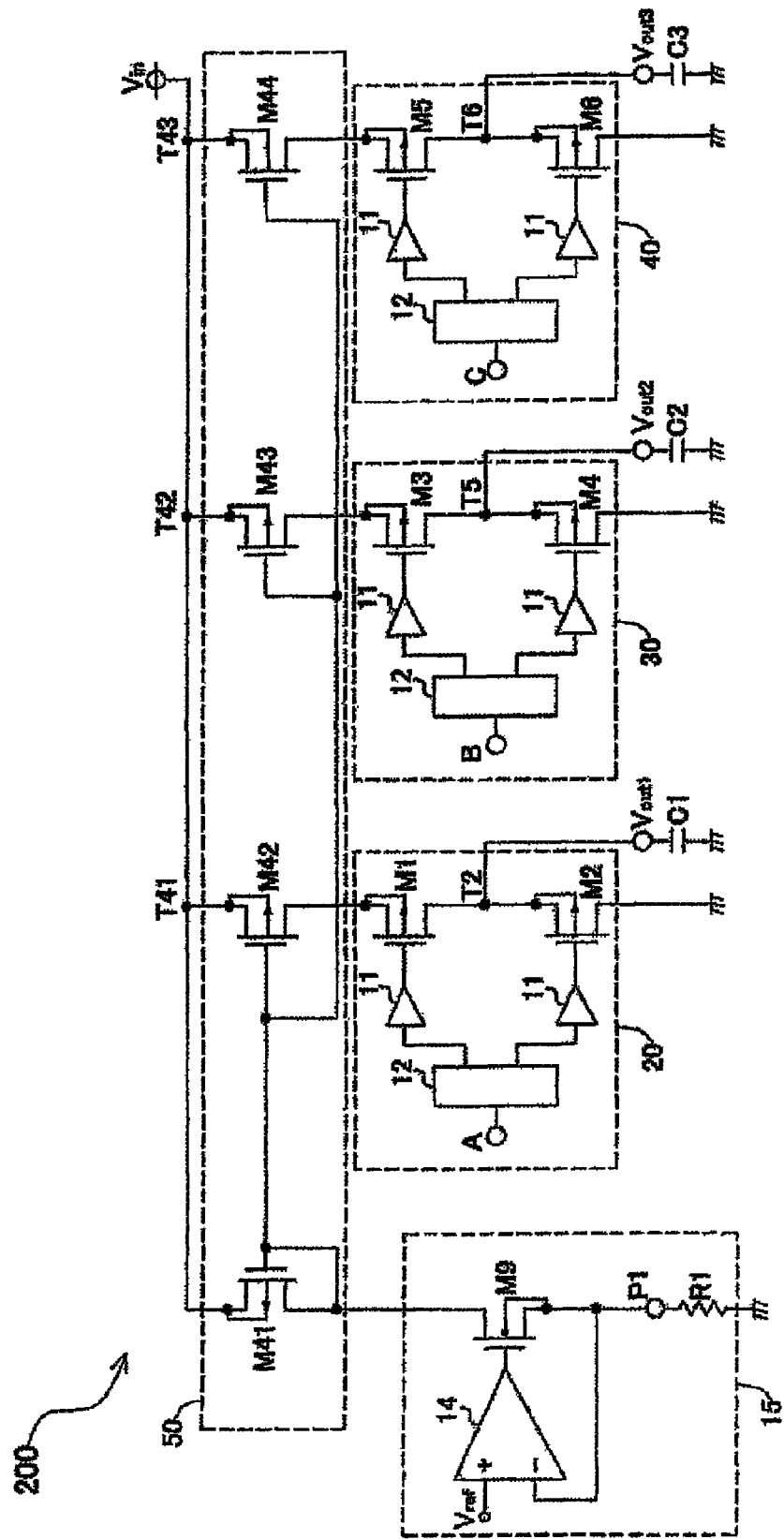
FIG. 4 is a circuit diagram of a drive circuit according to the third embodiment of the invention.

FIG. 4 illustrates another embodiment of the present invention in which does not include the second current mirror circuit 13 of the first two embodiments, and in which the first current mirror circuit (50) is connected between the power supply voltage source and the load drive circuits. The current mirror circuit 50 is configured by the P-type MOS transistors M41, M42, M43, and M44, wherein the P-type MOS transistor M41 is used as a common transistor.

Referring to FIG. 4, a P-type MOS transistor M41 is connected between the power supply voltage source Vin and the mirror current setting circuit 15, where a source of the P-type MOS transistor M41 is connected to the power supply voltage source Vin and a drain of the P-type MOS transistor M41 is connected to the drain of the N-type MOS transistor M9.

Also, the power supply voltage source Yin is connected to a source of a P-type MOS transistor M42 through a connecting point T41, a source of a P-type MOS transistor M43 through a connecting point T42, and a source of the P-type MOS transistor M44 through a connecting point T43. Drains of the P-type MOS transistors M42, M43, and M44 are connected to the load drive circuits 20, 30, and 40, respectively. Specifically, the drain of the P-type MOS transistor M42 is connected to the source of the P-type MOS transistor M1, the drain of the P-type MOS transistor M43 is connected to the source of the P-type MOS transistor M3, and the drain of the P-type MOS transistor M44 is connected to the source of the P-type MOS transistor M5.

Further, the gate of the P-type MOS transistor M41 is connected to the P-type MOS transistors M42, M43, and M44, and is also connected to the drain of the N-type MOS transistor M9.

According to a first stationary current in the N-type MOS transistor M9, a stationary current of a mirror current flows in the P-type MOS transistor M41. In addition, the stationary current flows in the P-type transistors M42, M43, and M44 only in the state where the load drive circuits 20, 30, and 40 are charging the capacitive loads C1, C2, and C3.

In the state where the P-type transistors M1, M3, and M5 are in an ON state, the loads C1, C2, and C3 are charged, and the currents flowing in the P-type transistors M1, M3, and M5 depends on the stationary current I11. Consequently, charge amounts of the loads C1, C2, and C3 are determined by the R1 determining the stationary current I1 of the mirror current setting circuit. That is, the charge time constants of the load drive circuits 20, 30, and 40 are determined by the resistor R1.

In addition, the MOS transistors for rapid charge according to the second embodiment can be installed in each of the above load drive circuits. For example, a P-type transistor may be connected between the power supply voltage source and the connecting point T2 and a gate of the P-type transistor is connected to the input interface circuit 12 in the load drive circuit 20.

As explained above, according to the drive circuits of the present embodiments, since the mirror current value flowing in the common transistor is set by the mirror current setting circuit, variations in the discharge time constant can be reduced without increasing the number of the resistors for determining the charge time constant of the driving path of the capacitive loads.

What is claimed is:

1. A drive circuit, comprising:
 a plurality of output drive terminals;
 a plurality of push-pull circuit stages, wherein each of the push-pull circuit stages includes a pair of complementary transistors having a common terminal connected to a respective output drive terminal;
 a plurality of first transistors connected in series with at least one of the pair of complementary transistors of the push-pull circuit stages, respectively;
 a common second transistor, wherein the common second transistor is connected with each of the plurality of first transistors to form a current mirror circuit; and
 a mirror current setting circuit for setting a mirror current flowing through the common transistor.

2. The drive circuit of claim 1, wherein the mirror current setting circuit comprises:
 an operational amplifier which receives a reference voltage;
 a transistor which is driven by the operational amplifier; and
 a resistor connected in series with the transistor;
 wherein a magnitude of the mirror current flowing through the common transistor is depend upon the reference voltage and a resistance of the resistor.

3. The drive circuit of claim 2, wherein the pair of transistors in each of the push-pull circuit stages have different conductivity types.

4. The drive circuit of claim 2, wherein the pair of transistors in each of the push-pull circuit stages have a same conductivity type.

5. The drive circuit of claim 1, flirter comprising an auxiliary transistor connected in parallel to at least one of the pair of transistors in each of the push-pull circuit stages.

6. The drive circuit of claim 2, further comprising an auxiliary transistor connected in parallel to at least one of the pair of transistors in each of the push-pull circuit stages.

7. The drive circuit of claim 5, wherein the pair of transistors in each of the push-pull circuit stages have a same conductivity type.

8. The drive circuit of claim 5, wherein the pair of transistors in each of the push-pull circuit stages have different conductivity types.

9. The drive circuit of claim 6, wherein the pair of transistors in each of the push-pull circuit stages have a same conductivity type.

10. The drive circuit of claim 6, wherein the pair of transistors in each of the push-pull circuit stages have different conductivity types.

11. The drive circuit of claim 1, wherein the pair of transistors in each of the push-pull circuit stages have a same conductivity type.

12. The drive circuit of claim 1, wherein the pair of transistors in each of the push-pull circuit stages have different conductivity types.

13. The drive circuit of claim 1, further comprising a second mirror current circuit supplies mirror current to the common transistor according to a current of the mirror current setting circuit.

14. The drive circuit of claim 13, wherein the plurality of first transistors are connected between a ground potential and the respective one of the pair of complementary transistors of the push-pull circuit stages.

15. The drive circuit of claim 1, wherein the plurality of first transistors are connected between a ground potential and the respective one of the pair of complementary transistors of the push-pull circuit stages.

16. The drive circuit of claim 1, wherein the plurality of first transistors are connected between a voltage source and the respective one of the pair of complementary transistors of the push-pull circuit stages.

* * * * *